United States Patent
Brown et al.

(10) Patent No.: US 7,936,564 B1
(45) Date of Patent: May 3, 2011

(54) MOBILE DISPLAYS AND RELATED METHODS

(75) Inventors: Clifford B. Brown, Smithfield, UT (US); Brent W. Brown, Farmington, UT (US); James B. Gover, Las Vegas, NV (US)

(73) Assignee: Young Electric Sign Company, Salt Lake City, UT (US)

( * ) Notice: Subject to any disclaimer, the term of this patent is extended or adjusted under 35 U.S.C. 154(b) by 0 days.

(21) Appl. No.: 12/620,148

(22) Filed: Nov. 17, 2009

(51) Int. Cl.
*H05K 7/20* (2006.01)
*G09F 21/04* (2006.01)

(52) U.S. Cl. ........ 361/695; 361/688; 361/690; 361/694; 454/184; 40/591

(58) Field of Classification Search .................. None
See application file for complete search history.

(56) References Cited

U.S. PATENT DOCUMENTS

| | | | |
|---|---|---|---|
| 5,649,730 A * | 7/1997 | Ramos ............................. | 296/21 |
| 6,379,209 B1 | 4/2002 | Tucker | |
| 6,769,726 B1 * | 8/2004 | Clark .............................. | 296/21 |
| 7,038,593 B2 * | 5/2006 | Pederson .................. | 340/815.45 |
| 7,131,226 B2 | 11/2006 | Gray et al. | |
| 7,154,383 B2 * | 12/2006 | Berquist .................... | 340/425.5 |
| 7,191,506 B2 | 3/2007 | Gray et al. | |
| 7,231,734 B2 * | 6/2007 | Gray et al. ....................... | 40/452 |
| 7,287,878 B2 * | 10/2007 | Miller ............................ | 362/282 |
| 7,478,492 B2 | 1/2009 | Madonia | |
| 2005/0060921 A1 | 3/2005 | Glynn | |
| 2006/0213100 A1 | 9/2006 | McCann | |
| 2007/0118423 A1 | 5/2007 | Always | |
| 2007/0182677 A1 | 8/2007 | Lee et al. | |
| 2007/0279314 A1 | 12/2007 | Brown | |
| 2009/0019748 A1 | 1/2009 | Rosarius | |

OTHER PUBLICATIONS

Litelogic, "The Outdoor Advertising Digital System," <<www.litelogic.com>>, accessed as of Oct. 1, 2009, 10 pages.

* cited by examiner

*Primary Examiner* — Boris L Chervinsky
(74) *Attorney, Agent, or Firm* — TraskBritt

(57) ABSTRACT

Mobile display apparatus and methods of operating mobile display apparatus are disclosed. Mobile display apparatus include a structure for attaching the display apparatus to a mobile structure and at least one display module coupled to the structure. The mobile display apparatus may include a ventilation feature. Methods of operating mobile display apparatus include disposing a plurality of removable display modules within a frame structure. A channel may be formed between the plurality of removable display modules and the frame structure and fluid may be forced through the channel and at least partially across the plurality of removable display modules.

23 Claims, 5 Drawing Sheets

MOBILE DISPLAYS AND RELATED METHODS

BACKGROUND

1. Field of the Invention

The present invention relates generally to displaying images, and more specifically, to displaying images on electronic display boards and electronic billboards coupled to a mobile structure.

2. State of the Art

Billboards (e.g., displays, signs, display boards, advertising displays, etc.) have been used for many years to convey information to a passerby such as advertising, traffic messages, and the like. Billboards may be a permanently fixed structure such as a stationary roadside billboard while other billboards may be attached to a mobile structure such as a bus, train, automobile, and other types of vehicles. Traditionally these signs and billboards were only capable of delivering a single message or advertisement. This message was generally in a printed medium and was adhered to the billboard. To change the message, new paper needed to be printed and adhered to the billboard.

More recently, stationary billboards have become electronic, using lights, light emitting diodes (LEDs), and other electronic devices to display visual content that can be easily adaptable to display a wide variety of messages in the form of words and images from the same sign without having to physically change the characteristics of the sign. These electronic boards can easily modify a graphic image or message to create video displays and modify the type of message or advertisement that is shown on the electronic board at regular intervals, or at targeted times depending on expected traffic near the sign, or public interest. These possible images are generally referred to herein as visual content.

For conventional billboards, the visual content is delivered to the physical location and affixed to the billboard. With electronic displays, the visual content must still be delivered to the physical location, but the content delivery may be performed electronically. In addition, while traditional billboards may display the same message for weeks or months at a time, electronic displays enable the message to be changed easily and often. Thus, it may be possible to modify the visual content many times in a single day. Furthermore, electronic displays may be networked together such that the displays may communicate with each other, or with a central computer.

SUMMARY

In some embodiments, the present invention includes a mobile display apparatus. The mobile display apparatus includes a first structure for attaching the display apparatus to a mobile structure and at least one display module coupled the first structure to form a channel extending between the first structure and the at least one display module. At least one display module may be positioned and configured to display at least a portion of an adaptable image. The mobile display apparatus may further include a ventilation system in communication with the channel.

In additional embodiments, the present invention includes a mobile display apparatus including a frame structure for attaching the display apparatus to a vehicle. The frame structure includes a cover retaining portion having a slot for receiving an edge portion of a display cover, a base portion for attaching the display apparatus to a vehicle, and at least one gasket disposed between the cover retaining portion and the base portion. The mobile display apparatus may further include a support structure coupled to the base portion of the frame structure and at least one display module coupled to the support structure. The at least one display module may be positioned and configured to display at least a portion of an adaptable image. The cover retaining portion may extend around the edges of the display cover and the display cover and the frame structure may substantially seal the at least one display module and support structure within the frame structure.

In yet additional embodiments, the present invention includes a method of operating a mobile display apparatus. The method includes disposing a plurality of removable display modules within a frame structure, forming a channel between the plurality of removable display modules and the frame structure, and forcing a fluid through the channel and at least partially across the plurality of removable display modules.

BRIEF DESCRIPTION OF THE DRAWINGS

While the specification concludes with claims particularly pointing out and distinctly claiming that which is regarded as embodiments of the present invention, the advantages of embodiments of the invention may be more readily ascertained from the following description of embodiments of the invention when read in conjunction with the accompanying drawings in which:

DETAILED DESCRIPTION

Figure 1:
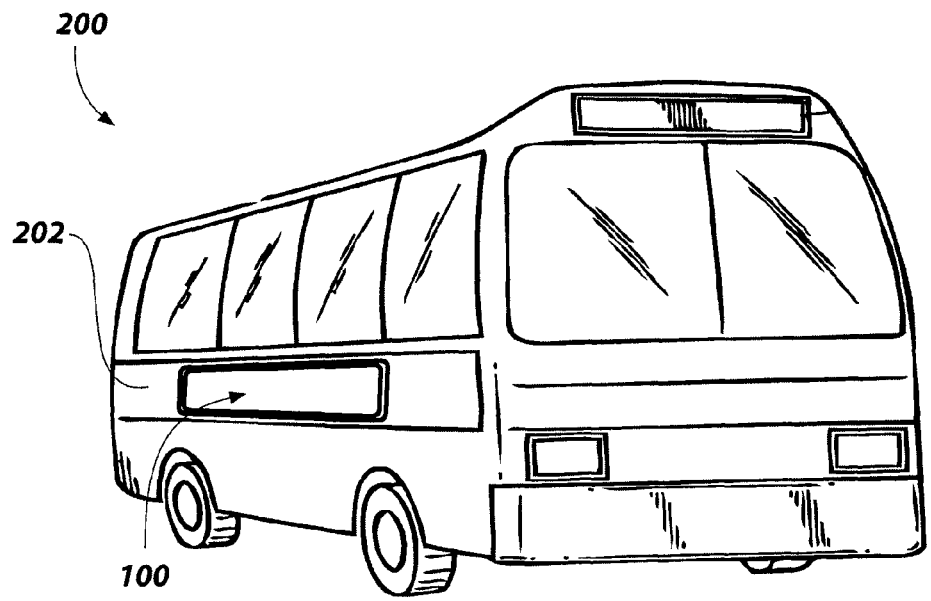
FIG. 1 shows a display apparatus attached to a vehicle in accordance with an embodiment of the present invention.

As shown in FIG. 1, a mobile display or billboard may be attached to a structure such as, for example, a vehicle 200 (e.g., a motor vehicle, bus, subway, taxi, train, light rail, automobile, truck, other mass transit vehicles, etc.). By way of example and not limitation, a mobile display (e.g., a display apparatus 100) may be attached to a side surface 202 of a mass transit vehicle 200 such as a bus.

Figure 2:
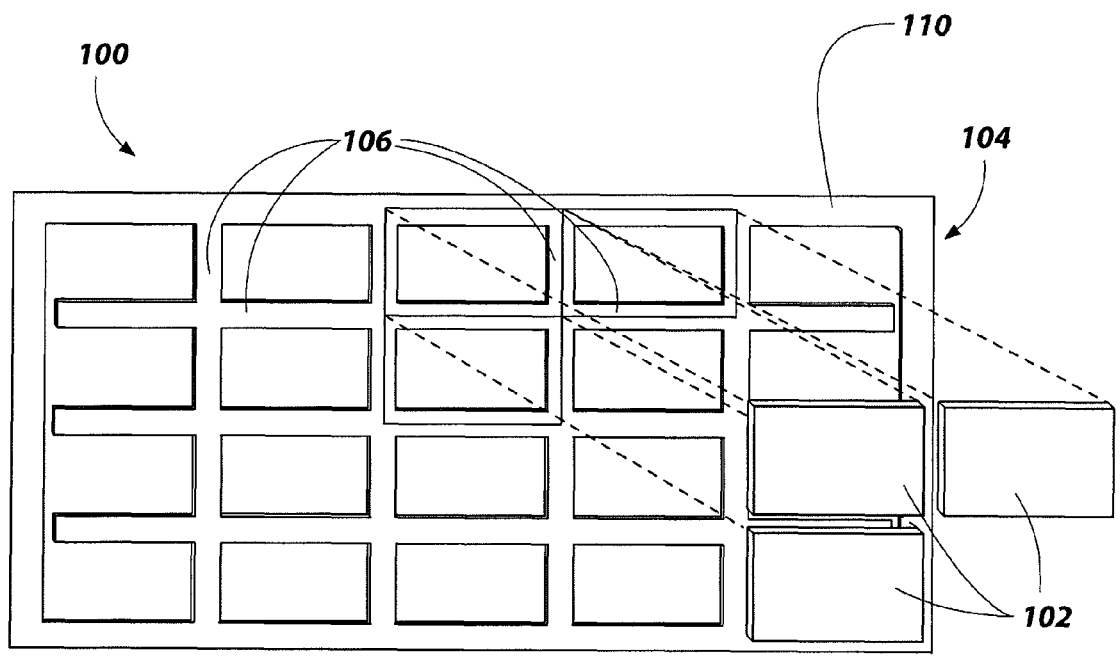
FIG. 2 shows an exploded view of a display apparatus including display modules attached to a support structure in accordance with another embodiment of the present invention.

FIG. 2 shows an exploded view of a display apparatus 100 including display modules 102 attached to a support structure 104. The display apparatus 100 may be comprised of a single display module 102, or, as illustrated in FIG. 2, a display apparatus 100 may comprise a plurality of display modules 102 arranged in a matrix organization. These display modules 102 may be arranged in a variety of configurations for different applications. For example, the matrix organization may include a single row of display modules 102 (or a single column of display modules 102) for creating a narrow yet long display, which may be suitable for displaying messages in a traveling ticker-tape type of arrangement. A small number of display modules 102 may be used to create a relatively small display apparatus 100, or a large number of display modules 102 may be arranged to create a relatively large display apparatus 100. By way of example and not limitation, a display apparatus 100 attached to the side of a mass transit vehicle (e.g., a bus) may include a matrix organization of display modules 102 in a rectangular configuration. Additionally, using a plurality of display modules 102 to form a larger display apparatus 100 may allow for the easier maintenance, installation, and removal of the display apparatus 100. For example, each display module 102 of the display apparatus 100 may be readily removed and replaced, such as by devices and methods described in U.S. Patent Publication No. 2007/0279314 A1, assigned to the assignee of the present invention, incorporated in its entirety herein by this reference. The display modules 102 of the display apparatus 100, such as described herein, may be formed from a variety of materials including, but not limited to, plastic, metal, composite materials (e.g., fiber-glass), etc.

Figure 4:
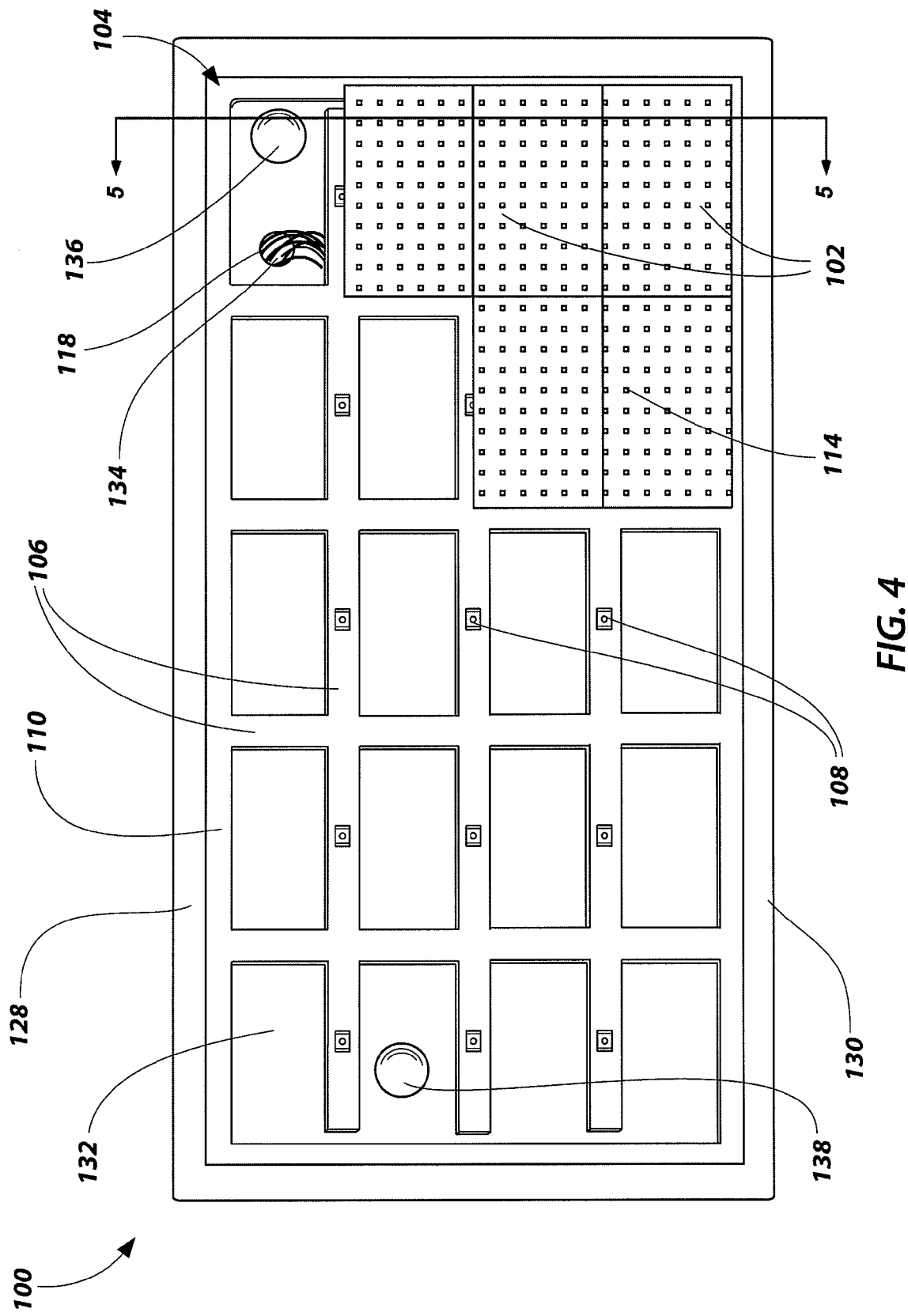
FIG. 4 shows a display apparatus in accordance with yet another embodiment of the present invention.

The plurality of display modules 102 may be coupled to a structure such as, for example, a support structure 104. It is noted that while the embodiment of FIG. 2 illustrates the display modules 102 coupled to the support structure 104, in some embodiments, the display modules 102 may be coupled to the frame structure 128 (FIG. 4). The support structure 104 may include a plurality of support members 106 (e.g., horizontal members and vertical members) and an outer rim 110. It is noted that while the embodiment of FIG. 2 illustrates horizontal members and vertical members, the support members 106 of the support structure 104 may be in various orientations including, but not limited to, entirely vertical or horizontal orientations, diagonal orientations, combinations thereof, etc. Moreover, in some embodiments, the support structure 104 may not include the outer rim 110. The support members 106 and outer rim 110 may be integrally formed to form an integral support structure 104. In other embodiments, the support members 106 and the outer rim 110 may comprise discrete elements coupled together to form the support structure 104.

As shown in FIG. 2, the support members 106 extend vertically and horizontally and are bounded by the outer rim 110. Each display module 102 may be placed in a removable panel position such that it abuts a neighboring display module 102 horizontally. The display modules 102 also may be stacked vertically to form the overall display apparatus 100 for presenting an adaptable image. The overall display apparatus 100 may be configured to display an adaptable image, such as, for example, a series of still images, or a video image. In some embodiments, which include a plurality of display modules 102, each display module 102 may be configured to form only a relatively small portion of the overall adaptable image.

Figure 3:
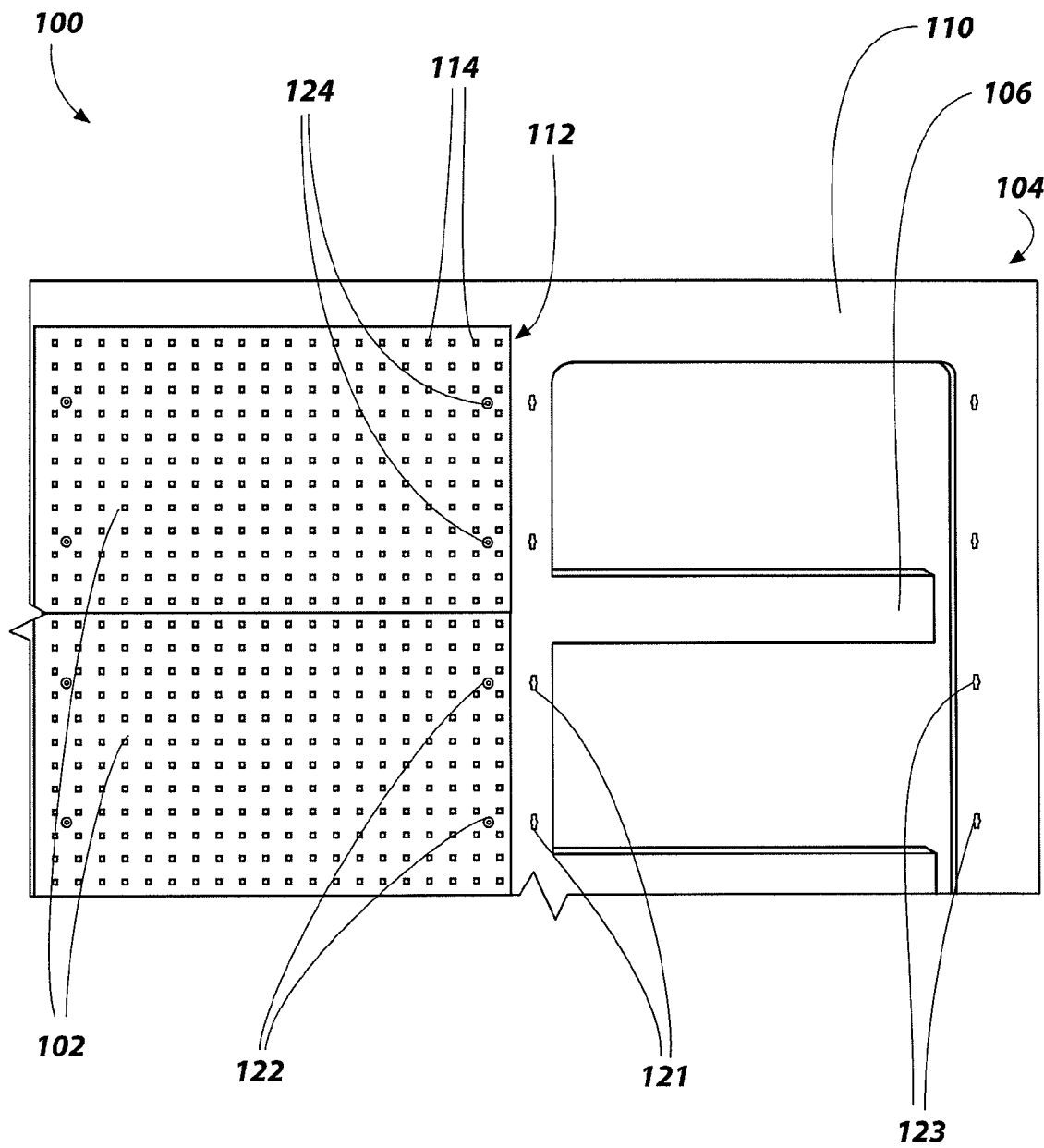
FIG. 3 shows an enlarged view of a portion of the display apparatus in FIG. 2.

FIG. 3 shows an enlarged view of a portion of the display apparatus in FIG. 2. As shown in FIG. 3, each display module 102 includes one or more pixel rows 112 comprising a plurality of pixel arrangements 114 positioned and configured to display at least a portion of an adaptable image. Each pixel row 112 may include a plurality of pixel arrangements 114. For example, each pixel arrangement 114 may include three light emitting diodes (LEDs), or other suitable light emitting devices. The pixel arrangement 114 may connected to a circuit board 164 (FIG. 6) and may include a lens disposed over the LEDs forming the pixel arrangements 114. In some embodiments, the pixel arrangements 114 may be similar to those described in U.S. Patent Publication No. 2007/0279314 A1, which, as discussed above, is incorporated herein by reference in its entirety. It is noted that while the display module 102 is illustrated with a plurality of pixel rows 112; the display module 102 may also be formed having only a single pixel row 112. It is further noted that other pixel arrangements 114 are contemplated within the scope of the present invention. For example, a pixel arrangement 114 may include a single light element or two light elements such as, for example, LEDs. Such a configuration of one or two LEDs may be used for a monochrome display, or may be configured with multi-color LEDs for each pixel, such that a multi-color display may be achieved even from a single LED for each pixel. In some embodiments, the pixels of the pixel rows 112 may include different discrete color sub-pixels for generating a merged pixel that appears as almost any color in the visible spectrum. Different colors may be merged to generate a color pixel. As a non-limiting example, a common combination of discrete colors contains red, green, and blue elements used to generate a merged color pixel. LED display modules may merge the colors from red LEDs, green LEDs, and blue LEDs to form color pixels. However, those of ordinary skill in the art will recognize that other colors for the LEDs may be used.

It will be understood by those of ordinary skill in the art that the display modules 102 may be electrically coupled via any suitable means such as, for example, by wires 118 (shown in FIGS. 4 and 5), data cables, power cables, fiber optic cables, etc. The display modules 102 may be electrically coupled to a control unit 120 (e.g., power supply, electronics, processors, etc.) (shown in FIG. 5) configured for controlling each of the display module 102, and each of the pixel arrangements 114 on each display module 102. For example, the control unit 120 (FIG. 5) may control operation of one or more LEDs within each pixel arrangement 114. Many wiring options may be possible, such as, for example, a serial connection between all of the display modules 102 such that the display modules 102 are essentially daisy-chained together. Furthermore, many control unit configurations are possible for controlling the pixels and defining what adaptable images, in the form of still images or video, may be displayed on the display apparatus 100.

Each display module 102 may further include coupler holes 122 (e.g., four coupler holes) formed through the display module 102, as shown in FIG. 3. These coupler holes 122 may be configured for receiving coupling devices 124 that may be used for coupling the display modules 102 to the support members 106 of the display apparatus 100. The coupler holes 122 may be located on side portions of the display modules 102 and may independently secure each display module 102 to the support members 106 of the support structure 104 when receiving the coupling devices 124. Each display module 102 may be individually installed and removed to for repair or replacement without the need to remove the entire display apparatus 100. Of course, additional embodiments of the display modules 102 may include less than, or more than, the four coupler holes 122 shown in FIG. 3. It is noted that while the embodiment of FIG. 3 illustrates the display modules 102 having coupler holes 122 to receive the coupling devices 124, the coupling devices 124 may also be formed as part of the display modules 102.

Referring still to FIG. 3, coupler holes 123 may be formed through the support members 106 of the support structure 104. The coupling devices 124 may be received within the coupler holes 123 of the support members 106 to attach the display modules 102 to the support structure 104. The coupling devices 124 may be configured such that when they are attached to the display modules 102 they can be operated from the front of the display modules 102 for attachment of the display modules 102 to the support structure 104. The coupling devices 124 may be any suitable attachment device, such as a screw, bolt, fastener, retainer, and the like. By way of example and not limitation, if the coupling devices 124 are operated by rotation, the coupling devices 124 may include a screwdriver slot, a Phillips head slot, a square key, a hex key, a star key, a hex head, a square head, a wing nut, etc. In some embodiments, the coupling devices 124 may comprise a keyed configuration having one or more flanges 126 (FIG. 6) extending from each of the coupling devices 124 that is cooperative with keys slots 121 formed in the coupler holes 123 of the support members 106. In such an embodiment, the coupling devices 124 may be secured by rotating the coupling devices 124 a quarter turn to secure the protrusions of the coupling device 124 in the coupler holes 123.

FIG. 4 shows a display apparatus 100 having a support structure 104 coupled with a structure (e.g., a frame structure 128) which may be attached to a mobile structure (e.g., the vehicle 200 (FIGS. 1 and 5)). As shown in FIG. 4, the outer rim 110 of the support structure 104 may be coupled to the frame structure 128. The frame structure 128 may include a cover retaining portion (e.g., side members 130) and a rear portion (e.g., rear member 132). In some embodiments, the rear member 132 of the frame structure 128 may be formed by a surface to which the frame structure 128 is attached (e.g., a side surface 202 of the vehicle 200 shown in FIG. 5). In some embodiments, the support structure 104 may be coupled to the frame structure 128 by mounts 108 formed in the support structure 104. For example, the mounts 108 may comprise a recessed portion of the support members 106 of the support structure 104 and may extend toward the rear member 132 of the frame structure 128. The mounts 108 may include an aperture formed therein for receiving an attachment device (e.g., a screw, bolt, fastener, retainer, etc.) to couple the support structure 104 to the frame member 128.

Figure 5:
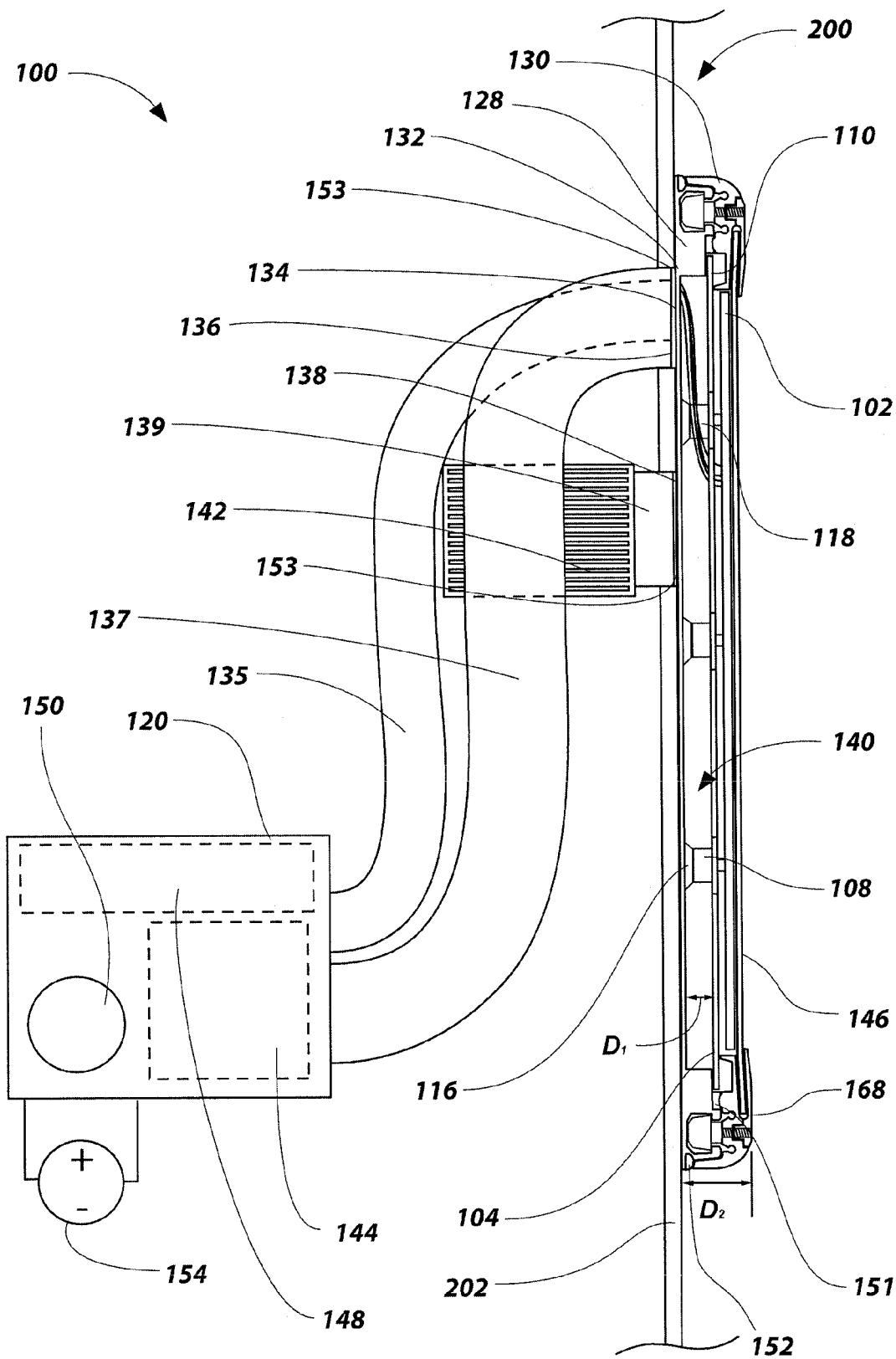
FIG. 5 shows a partial cross-sectional view of the display apparatus as indicated by section line 5-5 in FIG. 4.
Figure 6:
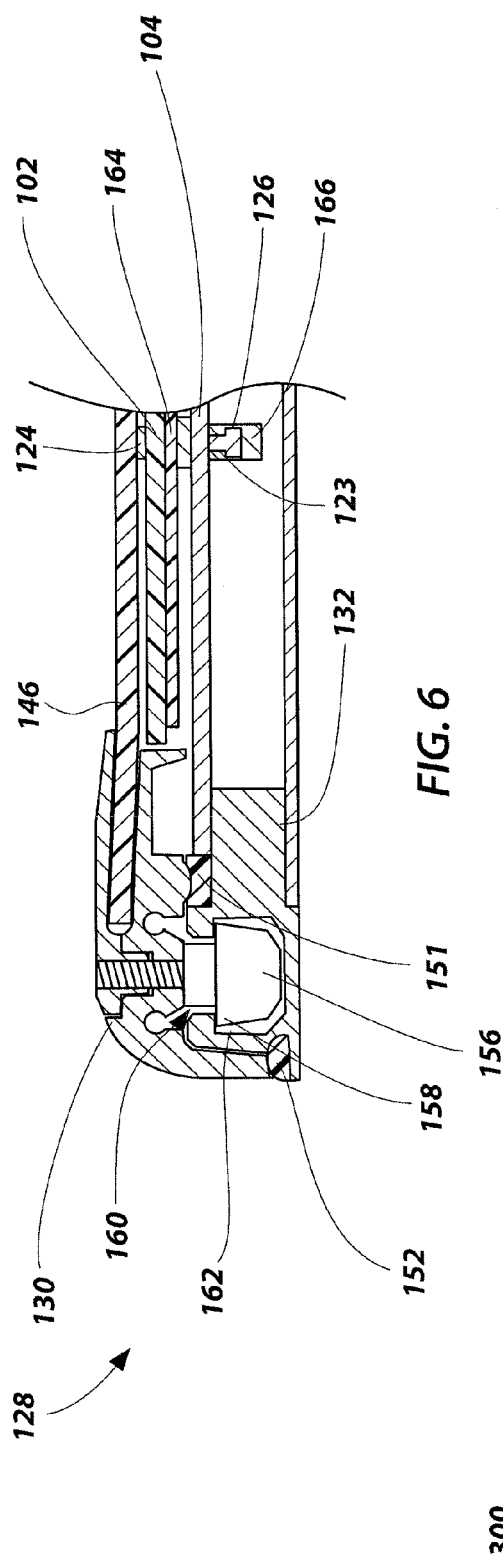
FIG. 6 shows an enlarged partial cross-sectional view of a portion of the display apparatus in FIG. 5.

As discussed above, each of the display modules 102 may include a plurality of pixel arrangements 114 that may be connected to a circuit board 164 (FIG. 6). The display modules 102 may each include wires 118 that transmit data and power to each of the display modules 102. Each of the display modules 102 may be configured to couple with the wires 118 by, for example, a wiring harness having a terminal or electrical connector. The wires 118 may extend from each of the display modules 102 through a wiring aperture 134 formed in the frame structure 128 to the control unit 120 (FIG. 5).

The frame structure 128 may include additional apertures that may facilitate ventilation of the display apparatus 100 (e.g., a ventilation outlet 136 and a ventilation inlet 138). The ventilation outlet 136 and ventilation inlet 138 may be disposed on side portions of the frame structure 128. For example, as shown in FIG. 4, the ventilation outlet 136 may be disposed on a first side portion of the frame structure 128 and the ventilation inlet 138 may be disposed on a second, opposing side portion of the frame structure 128. It is noted that the ventilation outlet 136 and the ventilation inlet 138 may be positioned at any location in the frame structure 128 suitable to facilitate fluid flow across a portion of the display modules 102. It is further noted that while the embodiment of FIG. 4 illustrates the ventilation outlet 136 and the ventilation inlet 138 as substantially circular apertures, the ventilation outlet 136 and the ventilation inlet 138 may be any suitable shape for moving a fluid (e.g., air) through the frame structure 128. For example, the ventilation inlet and outlet may comprise substantially rectangular apertures extending along opposing sides of the frame structure 128.

Referring now to FIG. 5, the outer rim 110 of the support structure 104 may be coupled to the frame structure 128 so that the support structure 104 is offset from the rear member 132 of the frame structure 128. As discussed above, the support structure 104 may be coupled to the frame structure 128 by the mounts 108. In some embodiments, the frame structure 128 may also include a protrusion (e.g., mounts 116) extending from the rear member 132 toward the mounts 108 of the support structure 104. The mounts 108, 116 may abut each other and may both include an aperture formed therein for receiving an attachment device to couple the support structure 104 to the frame member 128.

The support structure 104 may be offset from the frame structure 128 by a dimension $D_1$ and may form a channel 140 between the support structure 104 and the frame structure 128. The channel 140 may allow the wires 118 to be supplied to the display apparatus 100 through the wiring aperture 134 formed in the rear member 132 of the frame structure 128 and through a wiring conduit 135 coupled to the frame structure 128 proximate to the wiring aperture 134. It is noted that while the embodiment of FIG. 5 illustrates a relatively small amount of wires 118 extending to the display modules 102 for clarity, as understood by those of ordinary skill in the art, a relatively larger amount of wires running to each of the display modules 102 may be required to deliver power and data to each of the display modules 102. Although the support structure 104 may be offset from the frame structure 128 to form the channel 140 therebetween, the display apparatus 100 may still exhibit a dimension $D_2$ (i.e., a distance the display apparatus 100 extends outward from the side surface 202 of the vehicle 200 from which it is attached) that may still be relatively small (e.g., less than one inch (25.4 millimeters)).

The frame structure 128 of the display apparatus 100 may also include a display cover 146. The display cover 146 may abut a portion of the frame structure 128 (e.g., the side members 130). The display cover 146 may protect the display modules 102 and other components (e.g., the circuit board 164 (FIG. 6)) of the display apparatus 100 from water, dirt, or other contaminates. The display cover 146 may be formed from a transparent material (e.g., a transparent polymer such as polycarbonate resin thermoplastic marked commercially as LEXAN®) such that the display modules 102 may be viewed while being partially covered by the display cover 146. In some embodiments, the display cover 146 may form a seal with the frame structure 128. For example, the side members 130 of the frame structure 128 may receive side portions of the display cover 146 in a slot 168 formed in the side members 130. In some embodiments, the side members 130 may form a watertight seal around the display cover 146. As shown in greater detail in FIG. 6, one or more gaskets such as, for example, an inner gasket 151 and outer gasket 152 may be disposed between the side members 130 and the rear member 132. The inner gasket 151 and outer gasket 152 may extend around the side members 130 of the frame structure 128 to substantially seal the display apparatus 100. Stated in another way, the rear member 132 may form a first portion of the frame assembly 128 and the side members 130 and display cover 146 may form a second portion of the frame assembly 128. The first portion (i.e., the rear member 132) and the second portion (i.e., the side members 130 and display cover 146) may be coupled together with the gaskets 151, 152 disposed between the two portions to seal the display modules 102 within the frame structure 128. In some embodiments, the inner and outer gaskets 151, 152 disposed between the side members 130 and the rear member 132 of the frame assembly 128 may form a substantially watertight seal around the display modules 102 in the display apparatus 100.

Referring still to FIG. 6, a portion of the frame structure 128 may be removably coupled to the vehicle 200 (FIG. 5). For example, the side members 130 and the display cover 146 may be removably coupled to the rear member 132 of the frame structure 128, which is attached to the vehicle 200.

Coupler devices 156 may be configured with one or more flanges 158 such as, for example, flanges 158 on opposite sides of the substantially cylindrical coupler device 156. In attaching the side members 130 and the display cover 146 to the rear member 132, the flanges 158 may be aligned with key slots 160 in coupler holes 162 of the rear member 132 of the frame structure 128. After aligning the flanges 158 with the key slots 160, about a quarter turn of the coupler devices 156 in a first direction will fasten the side members 130 and the display cover 146 to the rear member 132 by the flanges 158 being seated against a surface of the rear member 132. After attachment, about a quarter turn of the coupler devices 156 in a second direction will align the flanges 158 on the coupler devices 156 with the key slots 160 such that the side members 130 and the display cover 146 may be enabled for removal. With the coupler devices 156 operated for removal, the side members 130 and the display cover 146 may be pulled free from the rear member 132. Once the side members 130 and the display cover 146 are removed, the display modules 102 may be accessed for repair, replacement, maintenance, etc.

As discussed above, the coupler devices 124 may couple the display modules 102 to the support structure 104. The coupler devices 124 may be configured with one or more flanges 126 such as, for example, flanges 126 on opposite sides of the substantially cylindrical coupler device 124. In attaching the display modules 102 to the support structure 104, the flanges 126 may be aligned with key slots 121 (FIG. 3) in the coupler holes 123 of the support structure 104. After aligning the flanges 126 and placing the coupler devices 124 inside the coupler holes 123, about a quarter turn of the coupler devices 124 in a first direction will fasten the display modules 102 to the support structure 104 by the flanges 126 being seated against the back side of the support structure 104 or, as shown in FIG. 6, the flanges 126 may be received in a receiver member 166 attached to the support structure 104. After attachment, about a quarter turn of the coupler devices 124 in a second direction will align the flanges 126 on the coupler devices 124 with the key slots 121 (FIG. 3) in the coupler holes 123 such that the display module 102 is enabled for removal.

Referring back to FIG. 5, the display apparatus 100 may further include additional gaskets 153 formed around the each of the wiring aperture 134, the ventilation outlet 136, and the ventilation inlet 138 formed in the frame structure 128 to substantially seal surfaces of the display apparatus 100 proximate to each of the wiring aperture 134, the ventilation outlet 136, and the ventilation inlet 138 against an abutting surface of the vehicle 200. The gaskets 151, 152, 153 may be formed from a material such as, for example, fiber, paper, rubber, silicone, metal, cork, felt, neoprene, rubber, fiberglass, polymers, etc.

As further shown in FIG. 5, each of the wiring aperture 134, the ventilation outlet 136, and the ventilation inlet 138 formed in the frame structure 128 may have a conduit attached to the frame structure 128 proximate to the respective aperture. For example, the wiring aperture 134 may have the wiring conduit 135 attached to the frame structure 128 proximate to the wiring aperture 134. The wires 118 may pass from the display modules 102 through the wiring aperture 134 and through the wiring conduit 135 to the control unit 120. The wiring conduit 135 may comprise any suitable material or structure, such as, for example, a tubing (e.g., flexible tubing, rigid pipe, etc.) comprising a polymer, vinyl, metal, composite, etc. In some embodiments, the wiring conduit 135 may act to protect the wires 118 passing therethrough. In such an embodiment, the wires 118 may pass through portions of the vehicle 200 (e.g., from the exterior to the interior of the vehicle 200) and may be protected and isolated by the wiring conduit 135.

The ventilation outlet 136 and the ventilation inlet 138 may have a ventilation outlet conduit 137 and a ventilation inlet conduit 139 attached the frame structure 128 proximate to the ventilation outlet 136 and the ventilation inlet 138, respectively. The ventilation outlet conduit 137 and the ventilation inlet conduit 139 may comprise any suitable material or structure, such as, for example, a tubing (e.g., flexible tubing, rigid pipe, etc.) comprising a polymer, vinyl, metal, composite, etc. One or both of the ventilation outlet conduit 137 and the ventilation inlet conduit 139 may connect a ventilation feature (e.g., a fan, vacuum, blower, etc.) to form a ventilation system that may force a fluid into or out of the display apparatus 100. For example, the ventilation outlet conduit 137 may connect to a fan 144 (e.g., a vacuum) in fluid communication with the channel 140. The fan 144 may create a suction force moving a fluid (e.g., air) from the channel 140 through the ventilation outlet 136. The fan 144 may transfer fluid from the channel 140 formed in the display apparatus 100 through the ventilation outlet 136 and the ventilation outlet conduit 137 to the fan 144 and may release the fluid at an exhaust port 150 formed in the control unit 120. It is noted that while the embodiment of FIG. 5 illustrates the fan 144 and the control unit 120 located in the same housing, the fan 144 and the control unit 120 may be provided in separate housings.

The ventilation inlet conduit 139 may be connected to the frame structure 128 proximate to the ventilation inlet 138 and may supply fluid to the display apparatus 100. For example, the ventilation inlet conduit 139 may be connected to a filter 142 (e.g., an air filter) and may be in fluid communication with the channel 140. The ventilation inlet conduit 139 may transfer fluid through the filter 142 and into the channel 140 formed in the display apparatus 100. The ventilation inlet conduit 139 and the filter 142 may be utilized in unison with the ventilation outlet conduit 137 and the fan 144 to transfer fluid through the channel 140 of the display apparatus 100. A fluid flow path may extend from the filter 142 through the ventilation inlet conduit 139 to the channel 140 and through the ventilation outlet conduit 137 to the exhaust port 150. Such flow or movement of fluid may dissipate heat (externally or internally generated) in the display apparatus 100 and cool the display modules 102 (i.e., fluid may transfer heat from the electronic components of the display modules 102 as it moves through the channel 140).

The flow of fluid through the channel 140 may also act to support the distal components of the display apparatus 100 (i.e., the components furthest away from the point of attachment of the display apparatus 100 to the vehicle 200). For example, the flow of fluid through the channel 140 may form a pressure differential (i.e., the pressure in the channel 140 may be less than an ambient pressure exterior to the display apparatus 100) that may tend to hold the display cover 146 proximate to the side surface 202 of the vehicle 200 (e.g., prevent the display cover 146 from bowing in a direction away from the vehicle 200). Stated in another way, the greater pressure exterior to the display apparatus 100 and display cover 146 may apply a force to the exterior surface of the display cover 146 (i.e., the surface of the display cover 146 exterior to the display apparatus 100) in a direction toward the side surface 202 of the vehicle 200 (i.e., in a direction toward the channel 140). Holding the display cover 146 proximate to the side surface 202 of the vehicle 200 may prevent deformation of the display cover 146 as it is subjected to forces caused by the movement of the vehicle 200 and other external forces.

The flow of fluid through the channel 140 may also act to inhibit condensation from gathering in the interior of the display apparatus 100.

It is noted that while the embodiment of FIG. 5 illustrates the ventilation outlet conduit 137 having a length longer than the ventilation inlet conduit 139 and extending further into the interior of the vehicle 200 than the ventilation inlet conduit 139, in some embodiments, the length of the ventilation inlet conduit 139 may be similar to, or longer than, the ventilation outlet conduit 137. It is also noted that while the embodiment of FIG. 5 illustrates the ventilation outlet conduit 137 and the ventilation inlet conduit 139 extending into the interior of the vehicle 200, the ventilation system may not include the ventilation outlet conduit 137 and the ventilation inlet conduit 139. For example, the fan 144 and the filter 142 may be coupled directly to the ventilation outlet and inlet 136, 138. In yet other embodiments, the frame structure 128 may be enlarged to house at least one of the fan 144 and the filter 142. In additional embodiments, the ventilation system may not include a filter.

Referring still to FIG. 5, the display apparatus 100 may further include a power supply 148 configured to supply electrical power to the display modules 102 or to components of the display modules 102 (e.g., the LEDs) through the wires 118. The wires 118 may extend from the display modules 102 through the channel 140 and the wiring conduit 135 to the power supply 148. In some embodiments, the power supply 148 may be connected to an external power source 154 such as, for example, an electrical system of the vehicle 200. For example, the display apparatus 100 and power supply 148 may be coupled to the interior of the vehicle 200 and may be connected to a power supply (e.g., a 24-volt power supply) of the vehicle 200. The electronics (e.g., the circuit board 164 (FIG. 6)) of the display modules 102 may be configured to operate on or convert a 24-volt source supplied by the electrical system of the vehicle 200. In some embodiments, the power supply 148 may include a converter to convert the 24-volt power supplied by the electrical system of the vehicle 200 to 12 volts that may be utilized to power the electronics of the display modules 102. In other embodiments, the power supply 148 may not be connected to an external power source and may include a power source integral with the display apparatus 100 (e.g., batteries, solar power source, etc.). Again, it is noted that while the embodiment of FIG. 5 illustrates the power supply 148 located in the same housing as the fan 144 and the control unit 120, the power supply 148 may be provided in a separate housing.

Figure 7:
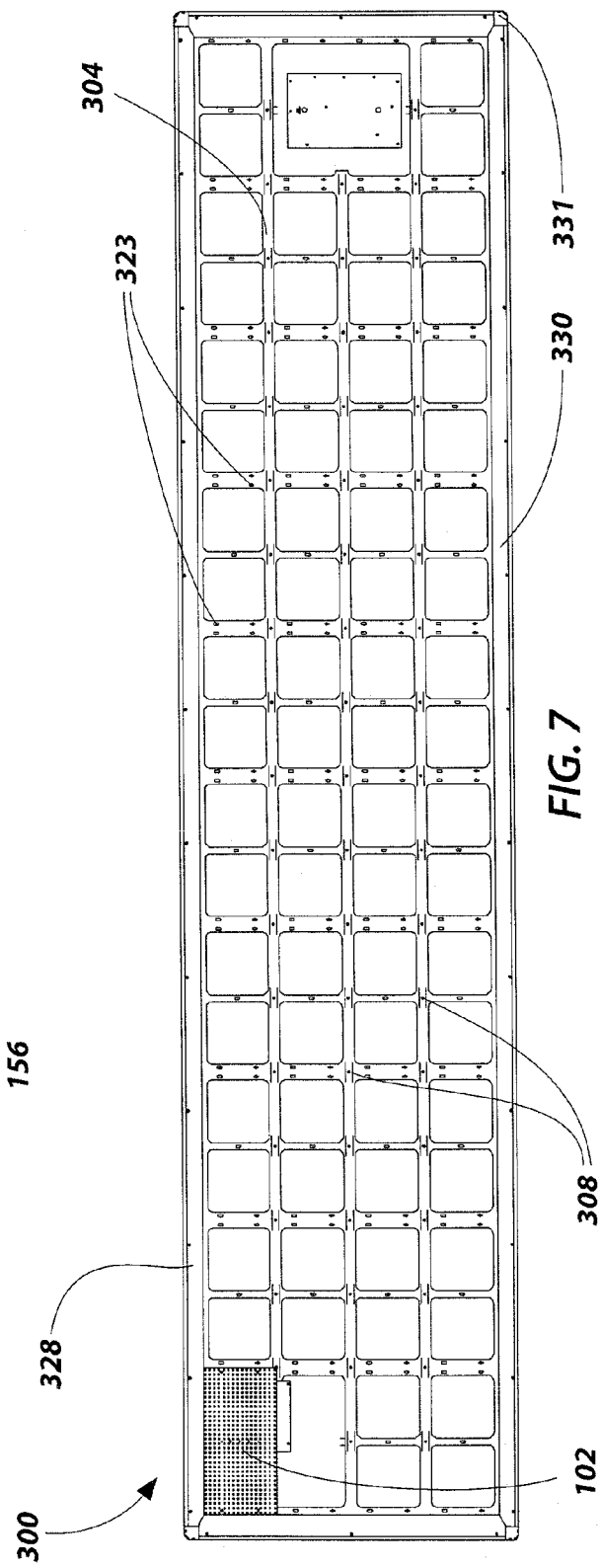
FIG. 7 shows a display apparatus in accordance with yet another embodiment of the present invention.

FIG. 7 shows a display apparatus in accordance with another embodiment of the present invention. As shown in FIG. 7, a display apparatus 300 may include one or more display modules 102, mounts 308 for coupling a support structure 304 to a frame structure 328, and coupler holes 323 for coupling the display modules 102 to the support structure 304. The support structure 304 may be configured to hold a plurality of display modules 102 (e.g., forty display modules). The display apparatus 300 may be dimensioned (e.g., about 2.5 feet (0.762 meter) in height and 12 feet (3.657 meters) in length) to fit on the side of a mass transit vehicle (e.g., a bus). The frame structure 328 of the display apparatus 300 may include side members 330 similar to the side members 130 described with reference to FIG. 6 and may also include corner members 331 that may seal the corners of the frame structure 328 and the display apparatus 300.

In view of the above, embodiments of the present invention may be particularly useful in providing a mobile display for vehicles such as a mass transit vehicle. The display may be mounted to the side surface of the mass transit vehicle and may have a relatively small width such that the display has a relatively low profile on the side of the vehicle. A ventilation feature or system may cool the electrical components of the display. The fluid movement provided by the ventilation may also act to hold the display cover proximate to the side surface of the vehicle and prevent the display cover from deforming due to the movement of the vehicle. The frame structure may also protect the display and facilitate the ventilation system by sealing the display and preventing containments (e.g., water, dirt, etc.) from damaging the display during its operation on a moving vehicle. The frame structure may also include a removable portion that may facilitate easy access to the display modules as compared to other display devices. Moreover, the removable display modules may enable damaged modules to be easily repaired and replaced as compared to other display devices.

Although the present invention has been described with reference to particular embodiments, the invention is not limited to these described embodiments. Rather, the invention is limited only by the appended claims and their legal equivalents, which include within their scope all equivalent devices or methods that operate according to the principles of the invention as described.

What is claimed is:

1. A mobile display apparatus, comprising:
   a first structure for attaching the display apparatus to a mobile structure;
   at least one display module coupled to the first structure to form a channel extending between the first structure and the at least one display module, the at least one display module positioned and configured to display at least a portion of an adaptable image; and
   a ventilation system in communication with the channel.

2. The mobile display apparatus of claim 1, further comprising a display cover abutting a portion of the first structure, the display cover and the first structure at least partially forming a seal around the at least one display module.

3. The mobile display apparatus of claim 2, wherein the first structure comprises:
   a cover retaining portion having a slot receiving an edge portion of the display cover therein;
   a base portion for attaching the display apparatus to a mobile structure; and
   at least one gasket disposed between the cover retaining portion and the base portion.

4. The mobile display apparatus of claim 1, further comprising a second structure coupled to the first structure to form the channel extending between the first structure and the at least one display module and wherein the at least one display module is coupled to the second structure.

5. The mobile display apparatus of claim 4, wherein the at least one display module comprises at least one removable display module and wherein the display apparatus further comprises a plurality of coupling members detachably coupling the at least one removable display module to the second structure.

6. The mobile display apparatus of claim 1, wherein the ventilation system comprises a fan in fluid communication with the channel through an aperture formed in the first structure, the fan configured to facilitate movement of a fluid through the channel.

7. The mobile display apparatus of claim 6, wherein the ventilation system further comprises a filter in fluid communication with the channel through another aperture formed in the first structure, the ventilation system configured to move a fluid through the filter into the channel and to move a fluid from the channel to an exhaust port formed in the ventilation system.

8. The mobile display apparatus of claim 1, wherein the first structure is configured to attach the display apparatus to an exterior surface of a mass transit vehicle.

9. The mobile display apparatus of claim 8, wherein the display apparatus extends less than one inch outward from an exterior surface of a mass transit vehicle.

10. The mobile display apparatus of claim 8, further comprising a power supply operably coupled to the at least one display module, the power supply connected to a power source of a mass transit vehicle and configured to convey power to the at least one display module from a power source of a mass transit vehicle.

11. A mobile display apparatus, comprising:
  a frame structure for attaching the mobile display apparatus to a vehicle, comprising:
    a cover retaining portion having a slot for receiving an edge portion of a display cover;
    a base portion; and
    at least one gasket disposed between the cover retaining portion and the base portion;
  a support structure coupled to the base portion of the frame structure; and
  at least one display module coupled to the support structure, the at least one display module positioned and configured to display at least a portion of an adaptable image, wherein the cover retaining portion extends around the edge portion of the display cover and wherein the display cover and the frame structure substantially seal the at least one display module and the support structure within the frame structure.

12. The mobile display apparatus of claim 11, wherein the support structure is coupled to the base portion of the frame structure to form a channel extending between the frame structure and the support structure and wherein the display apparatus further comprises a ventilation feature coupled to the frame structure, the ventilation feature in fluid communication with the channel through at least one aperture formed in the frame structure.

13. The mobile display apparatus of claim 11, wherein the display cover and the cover retaining portion are removably coupled to the base structure.

14. The mobile display apparatus of claim 13, wherein the display cover and the frame structure at least partially form a watertight seal around the at least one display module and the support structure.

15. The mobile display apparatus of claim 13, wherein the at least one gasket comprises an inner gasket and an outer gasket, each of the inner gasket and the outer gasket forming a seal between the cover retaining portion and the base portion of the frame structure.

16. A method of operating a mobile display apparatus, comprising:
  disposing a plurality of removable display modules within a frame structure;
  forming a channel between the plurality of removable display modules and the frame structure; and
  forcing a fluid through the channel and at least partially across the plurality of removable display modules.

17. The method of claim 16, further comprising:
  coupling the plurality of removable display modules to a support structure; and
  coupling the support structure to the frame structure.

18. The method of claim 16, further comprising removably coupling a display cover to the frame structure.

19. The method of claim 18, further comprising creating a pressure within the channel of the display apparatus that is less than an ambient pressure exterior to the display apparatus to apply a force to an exterior surface of the display cover in a direction toward the channel.

20. The method of claim 18, wherein removably coupling a display cover to the frame structure further comprises:
  sealing the plurality of removable display modules within the frame structure with the display cover; and
  removing the display cover to allow access to the display modules within the frame structure.

21. The method of claim 16, further comprising powering the plurality of removable display modules with an electrical system of a motor vehicle.

22. The method of claim 16, wherein forcing a fluid through the channel and at least partially across the plurality of removable display modules comprises:
  supplying a fluid through an aperture formed on a first side of the frame structure; and
  removing a fluid through another aperture formed on a second, opposing side of the frame structure.

23. The method of claim 22, wherein supplying a fluid through an aperture formed on a first side of the frame structure comprises supplying a fluid through a filter in fluid communication with the aperture and wherein removing the fluid through another aperture formed on a second, opposing side of the frame structure comprises removing a fluid with a fan in fluid communication with the another aperture.

* * * * *